(12) United States Patent
Gambetta et al.

(10) Patent No.: US 9,978,020 B1
(45) Date of Patent: May 22, 2018

(54) OPTIMIZING PHYSICAL PARAMETERS IN FAULT-TOLERANT QUANTUM COMPUTING TO REDUCE FREQUENCY CROWDING

(71) Applicant: INTERNATIONAL BUSINESS MACHINES CORPORATION, Armonk, NY (US)

(72) Inventors: Jay M. Gambetta, Yorktown Heights, NY (US); Easwar Magesan, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/473,011

(22) Filed: Mar. 29, 2017

(51) Int. Cl.
```
G06N 99/00    (2010.01)
H03K 19/195   (2006.01)
H03M 13/15    (2006.01)
H03K 19/003   (2006.01)
H03M 13/01    (2006.01)
H03M 13/00    (2006.01)
```

(52) U.S. Cl.
CPC .......... *G06N 99/002* (2013.01); *G06N 99/00* (2013.01); *H03K 19/00346* (2013.01); *H03M 13/005* (2013.01); *H03M 13/01* (2013.01); *H03M 13/154* (2013.01); *H03M 13/1575* (2013.01)

(58) Field of Classification Search
CPC ....... G06N 99/002; B82Y 10/00; G06F 11/10; H03K 19/195; H03M 13/1148; H03M 13/154; Y10S 977/933
See application file for complete search history.

(56) References Cited

U.S. PATENT DOCUMENTS

| | | | | |
|---|---|---|---|---|
| 7,966,549 B2 * | 6/2011 | Hollenberg | ............ | B82Y 10/00 |
| | | | | 714/764 |
| 9,111,230 B2 | 8/2015 | Gambetta et al. | | |
| 9,286,154 B2 * | 3/2016 | Ashikhmin | ............ | G06F 11/10 |
| 9,350,460 B2 | 5/2016 | Paik | | |
| 9,425,804 B2 * | 8/2016 | McDermott, III | . | H03K 19/1958 |
| 9,432,024 B2 | 8/2016 | Chow et al. | | |
| 9,438,245 B2 | 9/2016 | Bronn et al. | | |
| 9,524,470 B1 * | 12/2016 | Chow | .................. | G06N 99/002 |
| 9,762,262 B2 * | 9/2017 | Ashikhmin | ....... | H03M 13/1575 |
| 9,779,359 B2 * | 10/2017 | Svore | ................... | G06N 99/002 |

(Continued)

OTHER PUBLICATIONS

Suface code quantum computing by lattice surgery, Clare Horsman et al.*

(Continued)

*Primary Examiner* — Vibol Tan
(74) *Attorney, Agent, or Firm* — Cantor Colburn LLP; Vazken Alexanian

(57) ABSTRACT

A technique relates to quantum error correction. Code qubits are configured as target qubits, and the code qubits have a first dephasing time and a first anharmonicity. Syndrome qubits are configured as control qubits, and the syndrome qubits have a second dephasing time and a second anharmonicity. The target qubits and the control qubits are configured to form one or more controlled not (CNOT) gates. The first dephasing time is greater than the second dephasing time and the second anharmonicity is greater than the first anharmonicity.

18 Claims, 10 Drawing Sheets

(56) References Cited

U.S. PATENT DOCUMENTS

| | | | | |
|---|---|---|---|---|
| 2014/0201591 | A1* | 7/2014 | Ashikhmin | G06N 99/002 714/758 |
| 2015/0363707 | A1 | 12/2015 | Abraham et al. | |
| 2016/0112066 | A1 | 4/2016 | Ashikhmin | |
| 2016/0125311 | A1 | 5/2016 | Fuechsle et al. | |
| 2016/0267032 | A1 | 9/2016 | Rigetti et al. | |

OTHER PUBLICATIONS

Implementing a strand of a scalable fault-tolerant quantum computing fabric, Jerry M. Chow et al.*
Quantum error correction (QEC), Rainer Baumann.*
Building logical qubits in a superconducting quantum computing system, Gambetta et al.*
Quantum Error Correction for Beginners, Simon J. Davitt et al.*
B.E. Kane, "A Silicon-Based Nuclear Spin Quantum Computer", Nature, vol. 393, May 14, 1998, pp. 1-5.
Blais et al., "Cavity quantum electrodynamics for superconducting electrical circuits: An architecture for quantum computation", Phys. Rev. A 69, 062320, arXiv:cond-mat/0402216, 2004, pp. 1-14.
Bouchiat et. al., "Quantum coherence with a single Cooper pair", Phys. Scr., 76, 165, 1998, pp. 1-6.
Bravyi et al., "Quantum codes on a lattice with boundary", arXiv:quant-ph/9811052, 1998, pp. 1-6.
Chen et al. "Qubit architecture with high coherence and fast tunable coupling", Physical review letters, 2014, 1-10.
Cirac et al., "Quantum Computations with Cold Trapped Ions", Phys. Rev. Lett., vol. 74, No. 20, May 15, 1995, pp. 1-4.
Corcoles et al., "Demonstration of a quantum error detection code using a square lattice of four superconducting qubits", Nature Communications, DOI: 10.1038/ncomms7979, 2015, pp. 1-10.
Dennis et al., "Topological quantum memory", Phys., 43, arXiv:quant-ph/0110143, 2002, pp. 1-39.
DiVincenzo, "Fault-tolerant architectures for superconducting qubits", Physica Scripta, 2009, pp. 1-29.
DiVincenzo, "Quantum error correction and the future of solid state qubits", RWTH Aachen and Forschungszentrum Juelich, 2011, pp. 1-36.
E. Knill et. al., "A scheme for efficient quantum computation with linear optics", Nature, vol. 409, Jan. 4, 2001, pp. 1-7.
Gambetta et al., "Building logical qubits in a superconducting quantum computing system", arXiv:1510.04375, 2015, pp. 1-10.
Gershenfeld et al., "Bulk Spin-Resonance Quantum Computation", Science 17, vol. 275, 1997, pp. 1-8.
Ghosh et al., "High-fidelity CZ gate for resonator-based superconducting quantum computers", Physical Review A, 87 (2), 022309, 2013, pp. 1-22.
Ghosh et al., "Surface code with decoherence: An analysis of three superconducting architectures", Physical Review A, 86(6), 2012, pp. 1-14.
Horsman et al. "Surface code quantum computing by lattice surgery", Phys., 14, 123011, arXiv:1111.4022v3 Feb. 21, 2013, pp. 1-29.
Laflamme et al., "Perfect Quantum Error Correcting Code", Phys. Rev. Lett. 77, arXiv:quant-ph/9602019v1 Feb. 27, 1996, pp. 1-5.
Magesan, "Detecting arbitrary single-qubit errors in a planar sublattice of the surface code", Quantum Cybernetics and control Workshop, 2015, pp. 1-38.
Orlando et. al., "Superconducting persistent-current qubit," Phys. Rev. B 60, 15398, 1999, pp. 1-17.
Ramos et. al., "Evidence for Quantum entanglement between two Josephson-junction qubits", IEEE Trans. On Appl. Superconductivity Research, 11, 998, 2001, pp. 1-13.
Raussendorf et al., "Fault-tolerant quantum computation with high threshold in two dimensions", arXiv:quant-ph/0610082v2 May 14, 2007, pp. 1-4.
Sheldon et al., "Characterizing errors on qubit operations via iterative randomized benchmarking", arXiv:1504.06597v1 [quant-ph], DOI: 10.1103/PhysRevA.93.012301, Apr. 24, 2015, pp. 1-5.
Sheldon et. al., "Procedure for systematically tuning up crosstalk in the cross resonance gate", arXiv:1603.04821, 2016, pp. 1-6.
Shor, "Scheme for reducing decoherence in quantum computer memory", Phys. Rev. A, vol. 52, No. 4, pp. 1-4.
Steane, "Error Correcting Codes in Quantum Theory", Physical Review Letters, vol. 77, No. 5, Jul. 29, 1996, pp. 1-5.
Steffen et. al., "High-Coherence Hybrid Superconducting Qubit", Phys. Rev. Lett., 105, 100502, DOI: 10.1103/PhysRevLett.105.100502 , 2010, pp. 1-4.
Takita et. al., "Demonstration of weight-four parity measurements in the surface code architecture", arXiv:1605.01351, 2016, pp. 1-5.
Theis et al., "Simultaneous gates in frequency-crowded multilevel systems using fast, robust, analytic control shapes", Physical Review A, 93, 2016, pp. 1-13.
Yan et al., The Flux Qubit Revisited to Enhance Coherence and Reproducibility, arXiv preprint arXiv:1508.06299, pp. 1-63.
You et al., "Low-decoherence flux qubit", Phys. Rev. B 75, 140515, arXiv:1605.01351 [quant-ph] DOI: 10.1103/PhysRevLett.117.210505, 2007, pp. 1-4.
Jaesung Ku et al., "Capacitively Shunted Flux Qubits for Multi-Qubit Architectures", Bulletin of the American Physical Society, vol.62, No.4, Y51.8, Mar. 17, 2017 (Mar. 17, 2017).
Yun-Pil Shim et al., "Semiconductor-Inspired Design Principles for Superconducting Quantum Computing", Nature Communications, vol.7, 11059, Mar. 17, 2017 (Mar. 17, 2017).
PCT/EP2017/081433 International Search Report and Written Opinion, dated Mar. 9, 2018.
Jay M. Gambetta et al., "Optimizing Physical Parameters in Fault-Tolerant Quantum Computing to Reduce Frequency Crowding", Related Application; U.S. Appl. No. 15/896,651, Filed on Feb. 14, 2018.
List of IBM Patents or Patent Applications Treated as Related; (Appendix P), Filed Feb. 15, 2018; pp. 1-2.

* cited by examiner

FIG. 3    X PARITY CHECK

CONFIGURE CODE QUBITS AS TARGET QUBITS, THE CODE QUBITS HAVING A FIRST DEPHASING TIME AND A FIRST ANHARMONICITY  902

CONFIGURE SYNDROME QUBITS AS CONTROL QUBITS, THE SYNDROME QUBITS HAVING A SECOND DEPHASING TIME AND A SECOND ANHARMONICITY, WHEREIN ONE OR MORE CNOT GATES ARE FORMED BY THE TARGET QUBITS AND THE CONTROL QUBITS, WHEREIN THE FIRST DEPHASING TIME IS GREATER THAN THE SECOND DEPHASING TIME AND THE SECOND ANHARMONICITY IS GREATER THAN THE FIRST ANHARMONICITY  904

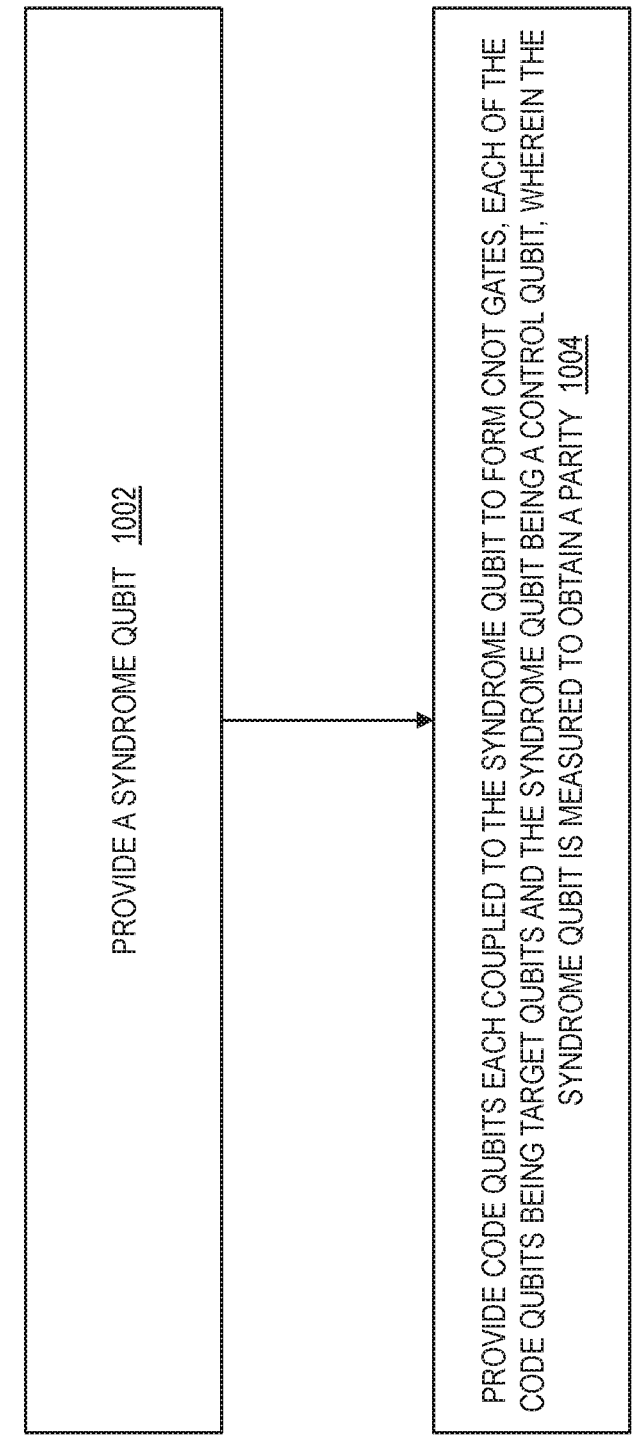

OPTIMIZING PHYSICAL PARAMETERS IN FAULT-TOLERANT QUANTUM COMPUTING TO REDUCE FREQUENCY CROWDING

STATEMENT REGARDING FEDERALLY SPONSORED RESEARCH OR DEVELOPMENT

This invention was made with Government support under Contract Number W911NF-16-1-0114 awarded by the U.S. Army. The Government has certain rights to this invention.

BACKGROUND

The present invention relates generally to superconducting electronic devices, and more specifically, to optimizing physical parameters in fault-tolerant quantum computing to reduce frequency crowding.

The fundamental element of a quantum computer is the quantum bit which is known as the "qubit". As opposed to a classical bit, representing zero and one, a qubit is also able to represent a quantum superposition of the two states. The states can be formalized within the laws of quantum physics as a probability of being in the two states. Accordingly, the states can be manipulated and observed within the laws of quantum physics.

Quantum properties include quantum entanglement and quantum teleportation of information, which is linked to the property of quantum entanglement. Quantum entanglement can exist between any two quantum systems such as between two photons, two atomic/ionic systems, or between a photon and an atom/ion based quantum system. Qubits are units of quantum information that can be visualized by a state vector in a two-level quantum-mechanical system. Unlike a binary classical bit, a qubit can have the values of zero or one, or a superposition of both. A qubit may be measured in basis states (or vectors), and a conventional Dirac symbol is used to represent the quantum state values of zero and one, such as for example $|1\rangle$ and $|0\rangle$. For example, on a physical qubit, this can be implemented by assigning the value zero "0" to a horizontal photon polarization and the value one "1" to the vertical photon polarization. The "pure" qubit state is a linear superposition of those two states which can be represented as a combination of $a|0\rangle + b|1\rangle$. Quantum computing makes use of properties associated with qubits. However, when utilizing qubits to perform computations on quantum computers, there needs to be a way to account for errors in quantum computing.

SUMMARY

According to embodiments of the present invention, a circuit for quantum error correction is provided. The circuit includes code qubits configured as target qubits, and the code qubits have a first dephasing time and a first anharmonicity. The circuit includes syndrome qubits configured as control qubits, and the syndrome qubits have a second dephasing time and a second anharmonicity. The target qubits and the control qubits are configured to form one or more controlled not (CNOT) gates, where the first dephasing time is greater than the second dephasing time and the second anharmonicity is greater than the first anharmonicity.

According to embodiments of the present invention, a method of configuring a circuit for quantum error correction is provided. The method includes configuring code qubits as target qubits, where the code qubits have a first dephasing time and a first anharmonicity. The method includes configuring syndrome qubits as control qubits, where the syndrome qubits have a second dephasing time and a second anharmonicity. The target qubits and the control qubits are configured to form one or more controlled not (CNOT) gates, where the first dephasing time is greater than the second dephasing time and the second anharmonicity is greater than the first anharmonicity.

According to embodiments of the present invention, a quantum error correction circuit is provided. The circuit includes a syndrome qubit and code qubits each coupled to the syndrome qubit to form controlled not (CNOT) gates. Each of the code qubits are target qubits and the syndrome qubit is a control qubit, where the syndrome qubit is measured to obtain a parity.

According to embodiments of the present invention, a method of configuring a quantum error correction circuit is provided. The method includes providing a syndrome qubit and providing code qubits each coupled to the syndrome qubit to form controlled not (CNOT) gates. Each of the code are being target qubits and the syndrome qubit is a control qubit, where the syndrome qubit is measured to obtain a parity.

According to embodiments of the present invention, a lattice arrangement for quantum error correction. The lattice arrangement includes rows of code qubits and rows of syndrome qubits arranged between the rows of code qubits. One syndrome qubit of the syndrome qubits is configured to control four code qubits of the code qubits in a controlled not (CNOT) gate.

BRIEF DESCRIPTION OF THE DRAWINGS

FIG. 9 is a flow chart of a method of configuring a circuit for quantum error correction according to embodiments.

FIG. 10 is a flow chart of a method of configuring a quantum error correction circuit according to embodiments.

DETAILED DESCRIPTION

Figure 1:
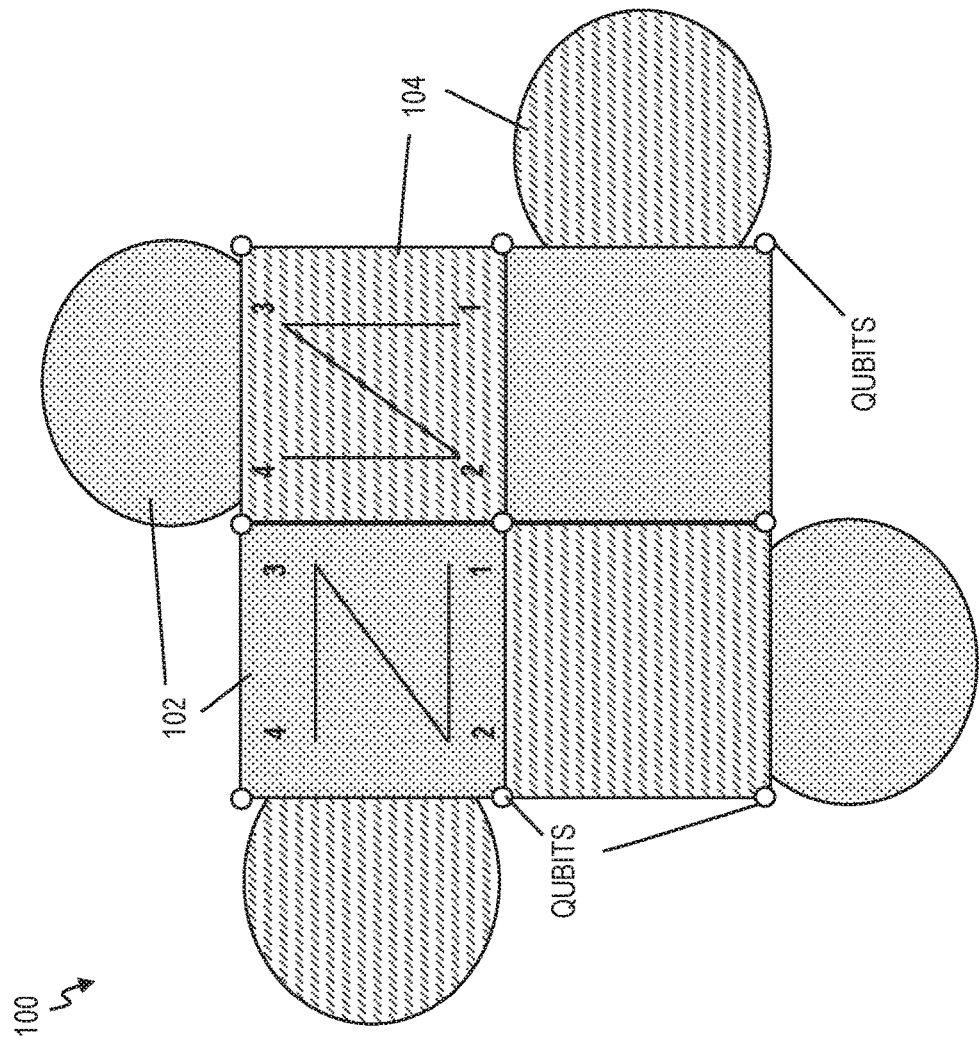
FIG. 1 is an example of a logical unit cell in rotated surface code according to embodiments of the present invention.

Various embodiments of the present invention are described herein with reference to the related drawings. Alternative embodiments of the present invention can be devised without departing from the scope of this document. It is noted that various connections and positional relationships (e.g., over, below, adjacent, etc.) are set forth between elements in the following description and in the drawings.

These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Several physical objects have been suggested as potential implementations of qubits. However, solid-state circuits, and superconducting circuits in particular, are of great interest as they offer scalability which is the possibility of making circuits with a larger number of interacting qubits. Superconducting qubits are typically based on Josephson junctions (JJ). A Josephson junction is two superconductors coupled by, for example, a thin insulating barrier. A Josephson junction can be fabricated by means of an insulating tunnel barrier, such as $Al_2O_3$, between superconducting electrodes. For such superconductor-insulator-superconductor (SIS) Josephson junctions, the maximum allowed supercurrent is the critical current $I_c$.

Quantum error correction schemes rely on arrays of qubits coupled together and acted on by external control to perform quantum gate operations. In quantum computing and specifically the quantum circuit model of computation, a quantum gate (or quantum logic gate) is a basic quantum circuit operating on a small number of qubits. They are the building blocks of quantum circuits, like classical logic gates are for conventional digital circuits. The most common quantum gates operate on spaces of one or two qubits, just like the common classical logic gates operate on one or two bits.

Quantum information processing (QIP) has the potential to efficiently solve certain problems that are believed to be intractable on a classical processor. Analogous in spirit to classical error correction, quantum error correction is required to perform fault-tolerant quantum computation. There are many different choices of experimental quantum systems and error-correcting codes for realizing fault-tolerant quantum computation, including superconducting circuits, ion-traps, nuclear magnetic resonance (NMR), defects in solids, and photonics. Superconducting circuit systems have emerged as a leading technology for a variety of reasons including highly deterministic and reproducible device fabrication, greatly improved coherence times, reduced operation errors, and circuit-QED approaches for coupling qubits to scale systems to larger sizes.

By nature, quantum states lose their information when measurements are directly performed on them. One of the main virtues of quantum error correction is the ability to measure useful information about errors that have occurred during a computation without destroying the encoded information. These measurements are formulated as parity measurements, where an even parity signals a computational step with no errors and an odd parity indicates errors have occurred. Some well-known examples of quantum error correction codes include Laflamme's 5-qubit code, Steane's 7-qubit code, Shor's 9-qubit code, and topological codes, which include the well-known surface code. Implementations of quantum error correction typically categorize the physical qubits as either code or syndrome qubits. Code qubits carry the useful quantum information and syndrome qubits are used to measure the parity of the quantum state. Embodiments are applicable to any such implementation.

However, for brevity and to provide a particular example, discussion is directed to surface code. For explanation purposes and not limitation, discussion is mainly focused on superconducting circuit systems to provide a fixed set of experimental parameters for illustration. However, it should be appreciated that embodiments of the present invention are applicable to any of these quantum systems, particularly when many degrees of freedom of similar energy (frequency) scales are to be manipulated.

The surface code has emerged as a promising quantum error correction code for superconducting qubits due to its planar nature and generous tolerance to errors on the physical qubits comprising the system. The fault-tolerant threshold is approximately 1%, which is relatively high compared to other common codes. In addition, only local low-weight parity measurements are required which is more compatible with realistic physical and geometrical constraints. In the surface code architecture, each physical qubit is coupled to its nearest neighbors forming a two-dimensional lattice where half of the qubits (code qubits) store the quantum information and the other half (syndrome qubits) are used to measure the parity of the state. There are many challenges in realizing fault-tolerant QIP that are ubiquitous across all types of implementations. One challenge is to optimize the parameters of the physical components with respect to their functionality. Another challenge is to both address and couple physical components (such as qubits) that are close together spatially and energetically (frequency crowding).

In the state-of-the-art, various types of qubits and lattice arrangements have been attempted to realize surface code computing with superconducting qubits. Superconducting qubits are generally classified as charge, phase, or flux qubits. Tunable qubits are desirable to help with frequency crowding. However, tunable qubits come at the cost of increased noise and overhead from having a tunable parameter. For example, flux-tunable qubits are highly sensitive to flux noise and require extra flux control lines. Fixed-frequency qubits on the other hand, such as the transmon, have reduced experimental overhead, fewer decoherence mechanisms, and generally longer coherence times than flux-tunable qubits. Recently small subsections of the surface code based on using both transmons and flux-tunable transmons have been demonstrated. The fixed-frequency approaches might have been relatively successful for small numbers of qubits, but operations become harder to perform with low error when more qubits are present because of significant crowding of frequencies in the state-of-the-art. Different lattice arrangements for realizing the surface code have also recently been proposed where the main goal is to minimize the total number of elements used while still performing all desired operations with high fidelity.

According to embodiments of the present invention, methods and structures are presented to address these problems in a general setting. Particularly, embodiments illustrate superconducting quantum computing with the surface code as illustrative examples. Because different qubits in the surface code have different functionality, a problem addressed in embodiments of the present invention is what types of qubits and lattice arrangements can be utilized to match the intrinsic functionality of the different elements in the surface code while not degrading the overall performance. In particular, embodiments provide an example arrangement to optimize the qubit parameters and the lattice arrangement in quantum error-correcting codes with respect to different qubit functionality. Additionally, the lattice arrangement addresses the issue of frequency crowding. Particularly, the parameter regime for qubits in the surface code include code qubits defined as long coherence qubits (LCQs) and syndrome qubits defined as large anharmonicity qubits (LAQs) according to embodiment. Embodiments are configured to rewrite Z and X parity checks so that syndrome qubits are control for all two-qubit gates. Additionally, Z errors on syndrome (control) can naturally occur from being LAQ but by virtue of rewriting Z and X parity checks these are converted to measurement errors, which are more tolerable. Because only single-qubit gates are implemented on code qubits the anharmonicity of code qubits can be decreased to increase the T2 time. Large anharmonicity of control qubits denotes less frequency crowding, and accordingly, the arrangement also overcomes the problem of frequency crowding.

Metrics for qubits are the coherence times T1 and T2. T1 is the energy relaxation time, and T2 is the dephasing time. Energy relaxation time T1 quantifies the time it takes for a qubit to decay from its excited state |1⟩ to the ground state |0⟩ (a bit-flip error). The dephasing time T2 is the time it takes for a quantum superposition state |+⟩ =(|0⟩ +|1⟩)/√2 to lose its phase relationship between |1⟩ and |0⟩ (i.e. a phase-flip error).

Now turning to the figures, FIG. 1 is an example of a logical unit cell in rotated surface code. The segments 102 correspond to Z parity checks, and the segments 104 correspond to X parity checks. Qubits are at vertices of each of squares. Controlled NOT (CNOT) gates are performed in the order indicated in the top two squares. A controlled NOT gate (also C-NOT or CNOT) is a quantum gate and is a component in the construction of a quantum computer. CNOT gate can be used to entangle and disentangle EPR states. Any quantum circuit can be simulated to an arbitrary degree of accuracy using a combination of CNOT gates and single qubit rotations. Furthermore, the CNOT gate is the "quantization" of a classical gate.

Figure 2:
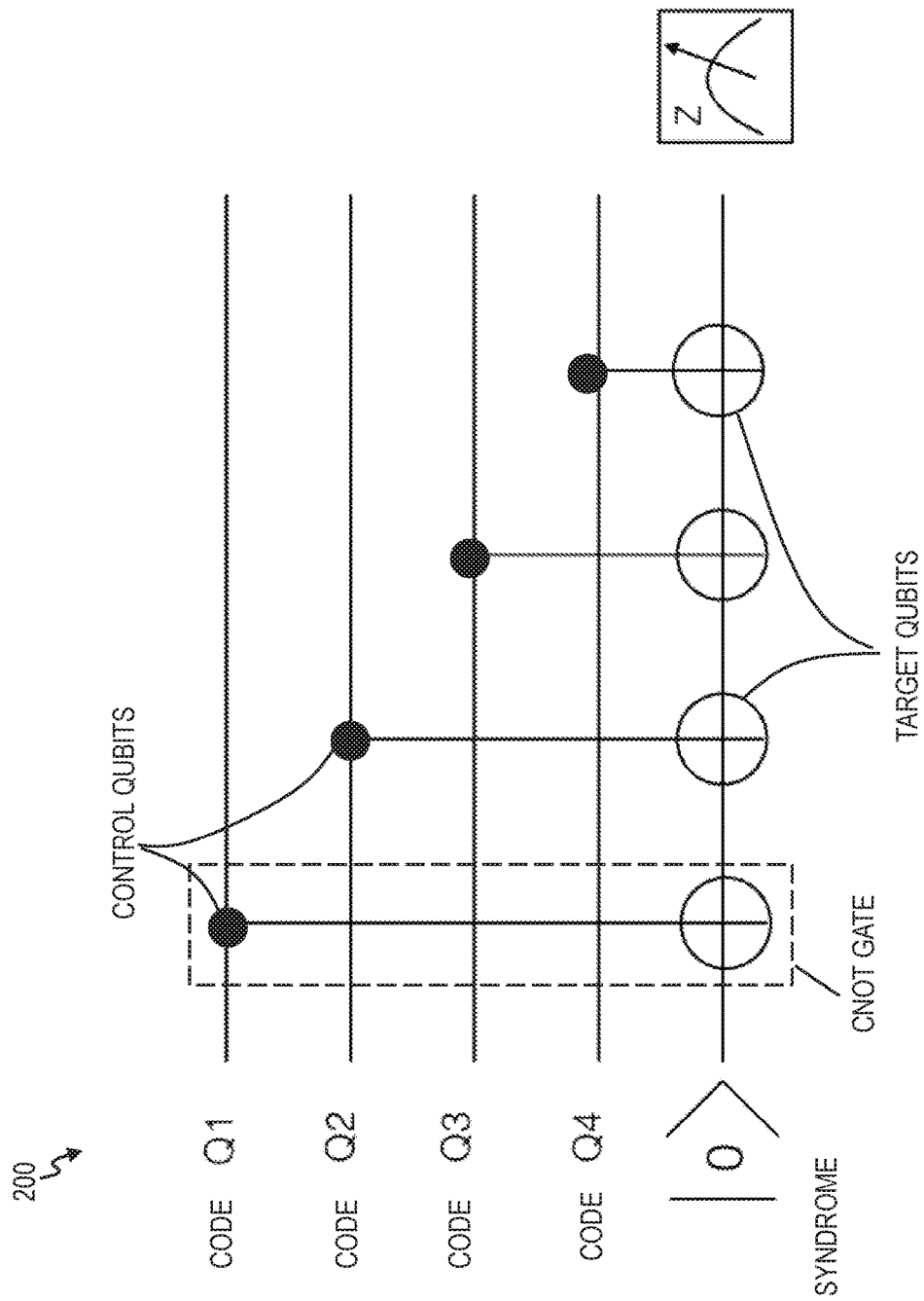
FIG. 2 is a circuit that performs a Z parity check embodiments of the present invention.
Figure 3:
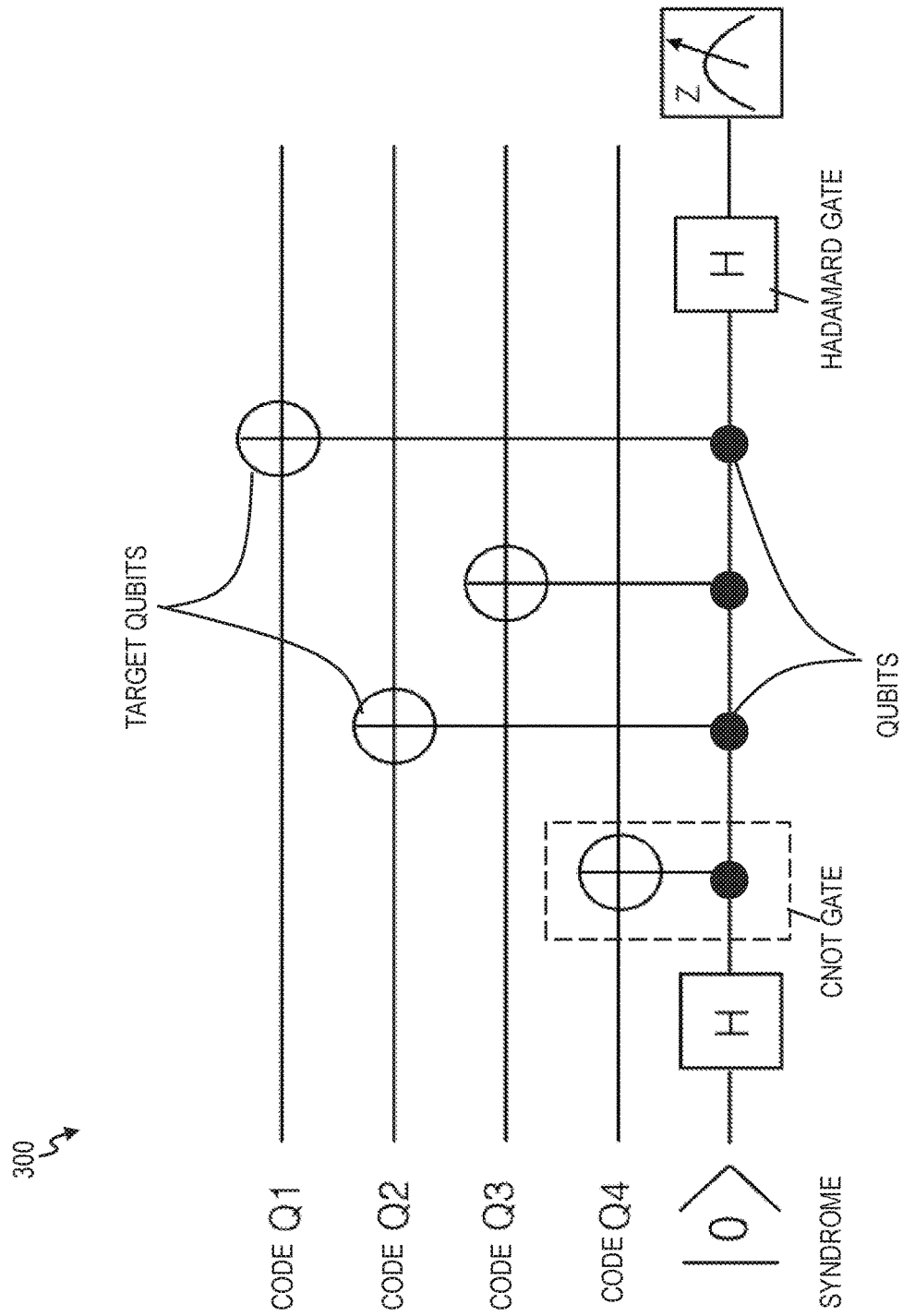
FIG. 3 is a circuit that performs an X parity check embodiments of the present invention.

Typical methods of writing the circuits for each Z and X parity check are shown in FIGS. 2 and 3 respectively. In FIGS. 2 and 3, CNOT gates are ordered for both parallelizability and to negate the effect of detrimental "hook" errors. A hook error corresponds to a correlated error occurring from a single fault in the syndrome qubit. Hook errors can produce logical errors if the CNOT gates are not ordered properly.

FIG. 2 is a circuit 200 that performs a Z parity check. The circuit 200 includes code qubits and a syndrome qubit. The code qubits are denoted as Q1, Q2, Q3, and Q4, and the code qubits can be a superposition of two states. The syndrome qubit is denoted as having a fixed state, for example, |0⟩. There are 4 CNOT gates shown. In each CNOT gate, a code qubit is connected to the syndrome qubit. In each CNOT gate, the syndrome qubit is the target qubit and the code qubits (Q1, Q2, Q3, Q4) are the control qubits. In other words, the parity is obtained by tapping into all code qubits at one time to perform the parity measurement via the CNOT gates. A measurement of the target qubits is performed on the syndrome qubit to obtain the parity (i.e., Z parity check) of the circuit 200. The parity can be even which is a zero "0" or odd which is a one "1". When the parity is even, this means that there is no X error in the computation. When the parity is odd, this means that there is an X error.

FIG. 3 is a circuit 300 that performs an X parity check. The circuit 300 includes code qubits and syndrome qubit. As noted above, the code qubits are denoted as Q1, Q2, Q3, and Q4. The syndrome qubit is denoted as having a fixed initial state, for example, |0⟩. Again, there are 4 CNOT gates shown. In each CNOT gate, a code qubit is connected to the syndrome qubit. Unlike FIG. 2, in each CNOT gate in FIG. 3, the syndrome qubit is the control qubit, and the code qubits (Q1, Q2, Q3, Q4) are the target qubits. The parity is obtained by tapping into all code qubits (as the target qubits) at one time to perform the parity measurement via the CNOT gates. A measurement of the control qubits is performed on the syndrome qubit to obtain the X parity (analogous to Z parity check of the circuit 200). The parity can be even which is a zero "0" or odd which is a one "1". When the parity is even, this means that there is no Z error. When the parity is odd, this means that there is a Z error.

In FIG. 3, the syndrome qubit connects to two Hadamard gates (H) on the line. One Hadamard is before the 4 control qubits (of the 4 CNOT gates) and a second Hadamard is after the 4 control qubits.

The Hadamard gate acts on a single qubit. In quantum information processing, the Hadamard transformation (also called Hadamard gate) is a one-qubit rotation, which maps the qubit-basis states |0⟩ and |1⟩ to two superposition states with equal weight of the computational basis states |0⟩ and |1⟩. As such, the Hadamard can be written as $$H = \frac{(|0\rangle + |1\rangle)}{\sqrt{2}}|0\rangle\langle 0| + \frac{(|0\rangle - |1\rangle)}{\sqrt{2}}|1\rangle\langle 1|.$$

In the exemplary circuits 200 and 300 for Z and X parity checks in FIGS. 2 and 3, the code and syndrome qubits are respectively used as the control for two-qubit gates.

Figure 4:
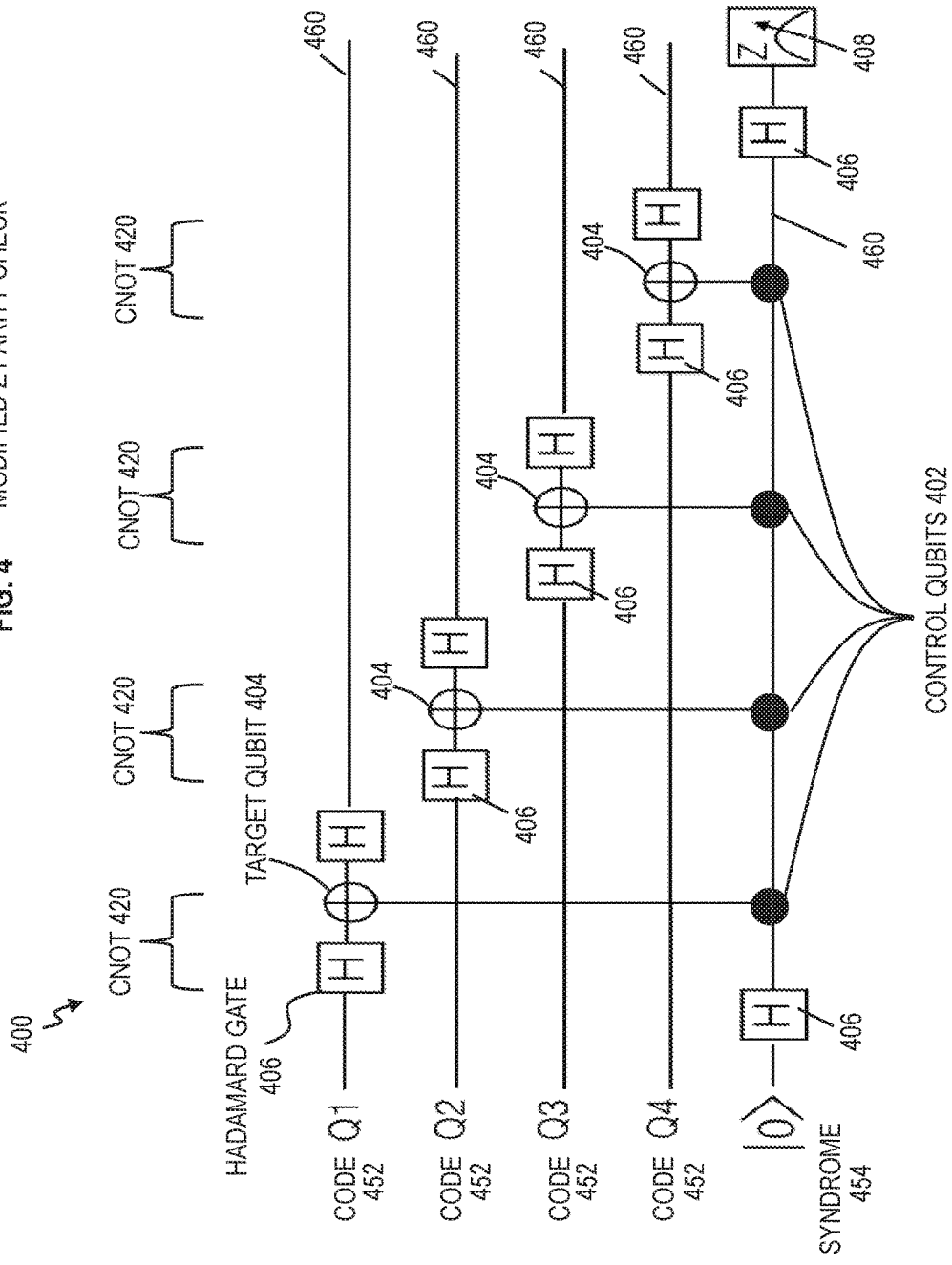
FIG. 4 is a schematic of a circuit for modified Z parity check according to embodiments of the present invention.
Figure 5:
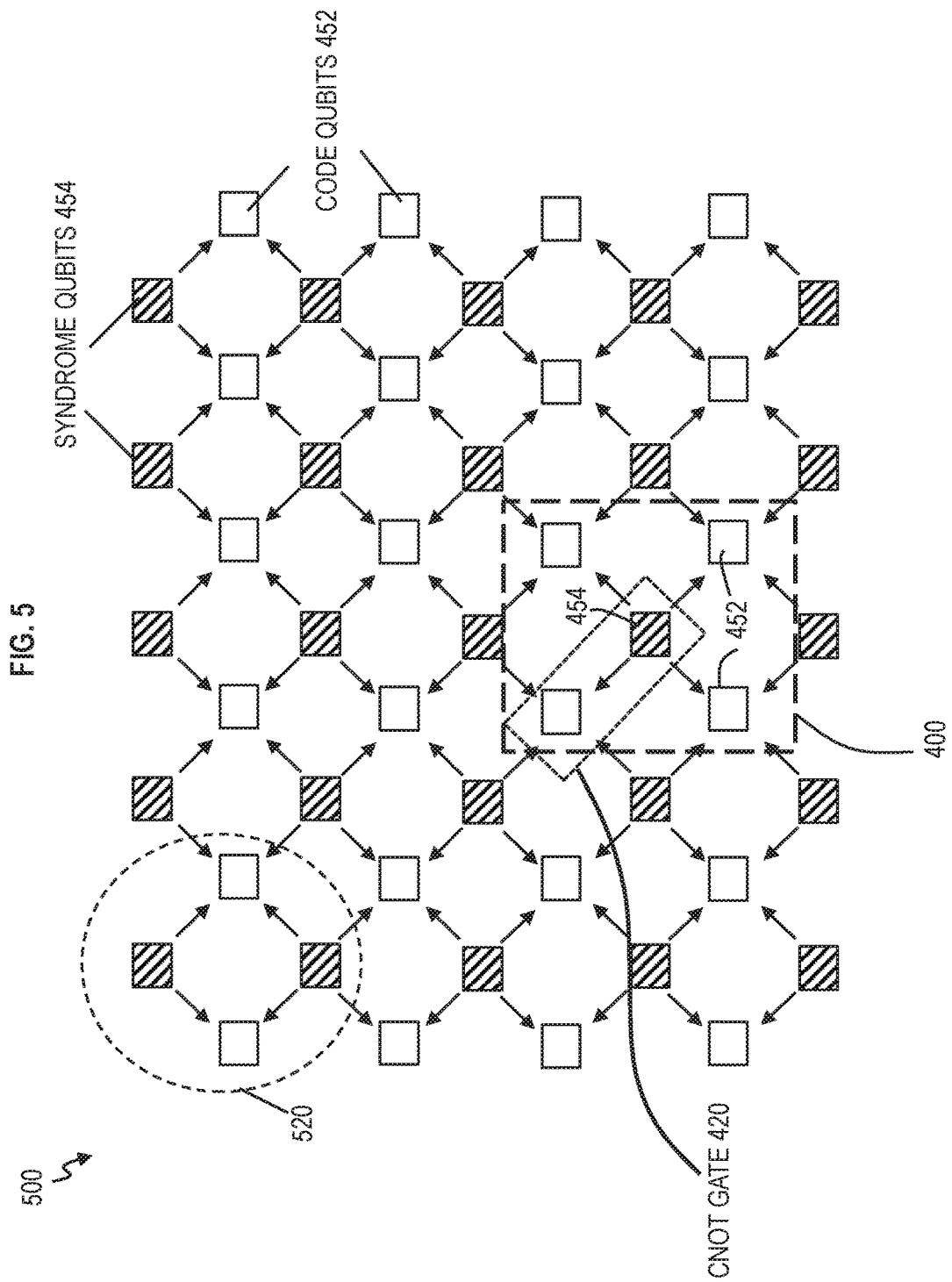
FIG. 5 is a schematic of a physical layout of a lattice arrangement including both code and syndrome qubits according to embodiments of the present invention.

In accordance with embodiments of the present invention, FIG. 4 is a schematic of a quantum error correction circuit 400 for Z parity check in surface error correcting code. FIG. 4 is a modified Z parity check with the syndrome qubits as the control qubit for every CNOT gate. In FIG. 4, the circuit 400 includes code qubits 452 denoted as Q1, Q2, Q3, Q4 along with the syndrome qubit 454. The syndrome qubit 454 is at a fixed state. It should be noted that the circuit 400 is only a subsection of an entire lattice of code qubits 452 and syndrome qubits 454, for example, as shown in FIG. 5. Also, it is noted that the lines 460 in FIG. 4 represent evolution in time are not physical components.

In the circuit 400, each CNOT gate 420 has a target qubit 404 and a control qubit 402. In FIG. 4, the syndrome qubit 454 is the control qubit 402 for each CNOT gate 420. The code qubits 452 are the target qubits 404 for each of the CNOT gates 420. On the timeline 460 of each code qubit 452, a Hadamard gate 406 is before and after each target qubit 404. Also, there is a Hadamard gate 406 before the control qubits 402 and after the control qubits 406 on the timeline 460 of the syndrome qubit 454. A measurement device 408 measures the parity (i.e., the parity of the control qubits 402 of the CNOT gates 420) connected to the syndrome qubit 454. The measurement device 408 can measure voltage or current. For example, measuring a low voltage (such as at or below a predefined threshold) can correspond to 0 (i.e., even parity), while measuring a high voltage (above the predefined threshold) can correspond to 1 (i.e., odd parity).

As seen in FIG. 4, embodiments are configured to rewrite the Z parity check so that the syndrome qubit 454 is always the control qubit 402 for the CNOT gates 420. As a result, both Z and X parity checks now have the syndrome qubit 454 as the control for two-qubit gates. With this modification, the circuit 400 can still perform the checks in parallel, and also hook errors do not pose a problem. For both X and Z parity checks in circuit 400, only X errors on the syndrome qubit 454 are kicked back to the code qubit 452, and Z errors on the syndrome qubit 454 are always propagated through to the measurement by the measurement device 408. Accordingly, embodiments of the invention have thus created another distinction between code and syndrome qubits, which is the syndrome qubits 454 are always the control qubit 402 for two-qubit gates so that only single-qubit operations are performed on the code qubits 452. Each CNOT 420 uses one code qubit 452 and the syndrome qubit 454, thus being two-qubit gates. Since the syndrome qubit 454 is fixed, the only operations are on the code qubit 452, and thus the CNOT gates 420 have single-qubit operations performed on the code qubits 452.

Additionally, embodiments of the invention are configured to use two sets of superconducting qubits in the circuit 400 with fundamentally different properties as presented herein. The first set of qubits corresponds to the code qubits 452 and consists of qubits with long T1 and T2 coherence times, which are called "long coherence qubits" (LCQs). The second set of qubits corresponds to the syndrome qubits 454 and consists of qubits with long T1 times and large anharmonicity, and these are called "large anharmonicity qubits" (LAQs). The LAQs are designated as the control qubit 402 for any two-qubit gate such as the CNOT gate 420. As a result, code qubits 452 are only controlled to perform single-qubit gates. Later, it will be shown that the amount of frequency crowding is directly related to the anharmonicity of the control qubit 402 in two-qubit gates, which is a benefit of having the syndrome qubits 454 as LAQs in accordance with embodiments.

It should be noted that requiring the syndrome qubits 454 to be LAQs does not significantly impact the performance of the surface code. This is because there is a trade-off between anharmonicity and T2 times. In particular, small anharmonicity qubits tend to have long T2 times, and as the anharmonicity is increased the T2 time decreases. Thus, requiring syndrome qubits 454 to be LAQ implies syndrome qubits 454 have short T2 times, which could result in large dephasing (Z) errors. However, because the syndrome qubits 454 are LAQs in accordance with embodiments, these Z errors are propagated to become measurement errors, and measurement errors have a much larger threshold than gate errors (in the CNOT gate 420). Consequently, the impact of designating the syndrome qubits 454 to be LAQs is minimal. Moreover, having a much larger threshold for measurement errors than gate errors means that the quantum error correction circuit 400 is configured to tolerate errors on the measurement (which is measured via the measurement device 408) more than on the CNOT gates 420. The syndrome qubits 454 can be charge, phase, and/or flux qubits. In some embodiments, possible implementations for the LAQs include the standard Cooper pair box charge qubit and the capacitively-shunted flux qubit because they can provide a higher anharmonicity.

Figure 8:
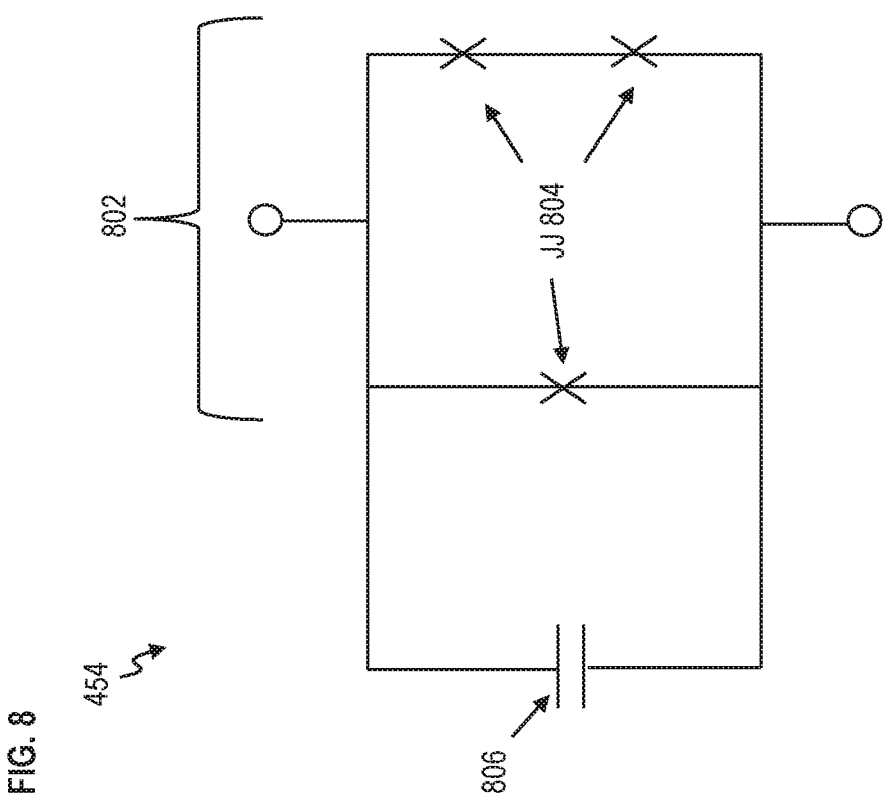
FIG. 8 is an example circuit of a syndrome qubit with a large anharmonicity and potentially smaller dephasing time according to embodiments of the present invention.

As noted above, the syndrome qubits 454 (LAQs) are configured to have large anharmonicity 454 (LAQs) and smaller T2 dephasing time (as compared to the code qubits 452 (LCQs)). In some embodiments, short T2 dephasing time for syndrome qubits 454 (LAQs) can range from hundreds of nanoseconds to a few microseconds. A large anharmonicity for syndrome qubits 454 (LAQs) can range from about 800-900 MHz in some embodiments. In an implementation, the large anharmonicity for syndrome qubits 454 (LAQs) can be about 840 MHz. In one implementation, large anharmonicity for syndrome qubits 454 (LAQs) can range from about 900-1000 MHz, but it is noted that as anharmonicities increase (larger than 1 GHz), the syndrome qubits 454 (LAQs) become more susceptible to noise. Accordingly, the range from about 800-900 MHz is better at avoiding the possibility of noise associated with syndrome qubits 454 (LAQs). A particular example of syndrome qubits 454 (LAQs) configured to function as discussed herein is a capacitively shunted direct current superconducting quantum interference device (dc-SQUID) 802 having 3 Josephson junctions (JJs) 804 in a loop as depicted in FIG. 8. In FIG. 8, the syndrome qubit 454 includes a shunting capacitor 806 in parallel with the 3 JJs 804 of the dc-SQUID 802. It is understood that magnetic flux can thread the loop formed by the JJs 804 in order to tune the syndrome qubit 454. FIG. 8 is simply an example circuit of a syndrome qubit 454 with a large anharmonicity and small T2 dephasing time according to embodiments.

The code qubits 452 are LCQs and can also be charge, flux, and/or phase qubits. The main constraints on the LCQs are that they have long T2 coherence times and that high-fidelity single-qubit gates can be performed on them. Because longer T2 times can be achieved when the anharmonicity is small, the code qubits 452 can be designed to have relatively small anharmonicity. Code qubits 452 can have relatively low anharmonicity in the range of about 200-400 MHz. In particular, because only single-qubit gates are implemented on the code qubits 452, low anharmonicity has less impact on the overall performance (i.e., high-fidelity fast single-qubit gates can be obtained even with code qubits 452 having relatively low anharmonicity in the 200-400 MHz). For code qubits 452, a large T1 time can be greater than about 80 microseconds (μs) in some embodiments. In an implementation, a large T1 time can be greater than about 100 μs. In some embodiments, a large T2 dephasing time for code qubits 452 (LCQs) can be greater than about 120 μs. In an implementation, a large T2 dephasing time can be greater than about 150 μs. In some embodiments, a small anharmonicity for code qubits 452 (LCQs) can be about 200 MHz.

FIG. 5 is an example physical layout 500 of a lattice arrangement including both code (LCQs) and syndrome (LAQs) qubits according to embodiments. Bus resonators couple four qubits, two code and two syndrome qubits. The syndrome qubits 454 are always the control for the two-qubit gates, and the control is depicted by the directionality of the arrows. As illustrated in circuit 400 in FIG. 4, one syndrome qubit 454 can be the control qubit for (as many as) 4 two-qubit gates involving 4 code qubits 452. It should be noted that FIG. 5 is a single example of the many that are possible using the techniques discussed herein. Any physical layout is possible as long as the required conditions on the code and syndrome qubits are met via LCQs and LAQs respectively.

As the circuit 400, a highlighted square illustrates how one syndrome qubit 454 can be the control qubit 402 for 4 code qubits 452 that are the target qubits 404. The directionality of the arrows indicate that the one syndrome qubit 454 is the control for the 4 code qubits 452 in the highlighted square. Although 1 example circuit 400 is highlighted, it should be appreciated that there are numerous circuits 400 in the physical layout 500. A syndrome qubit 454 is connected in the circuit 400 with neighboring 4 code qubits 452 in the direction of the arrow (showing control from the syndrome qubit 454 to the neighboring code qubits 452). Additionally, numerous CNOT gates 420 are formed between each syndrome qubit 454 and its neighboring code qubit 402 in the direction of the arrow. For example, a single CNOT gate 420 is identified as a rectangular box within the highlighted square so as not to obscure the figure, although there are a total of 4 CNOT gates 420 present in the highlighted square representing the circuit 400. Single-qubit gates, such as Hadamard gates, are not shown, as this figure mainly serves to depict connectivity and directionality.

The highlighted circle 520 represents an example bus resonator. Each bus resonator is configured to couple qubits in four-qubit loops defined by having two code qubits 452 on the horizontal row. Bus resonators are typically superconducting co-planar waveguides or transmission line resonators whose purpose is to couple qubits to enable multi-qubit operations. It is appreciated that the syndrome qubits 454, code qubits 452, and Hadamard gates 406 can be coupled/connected via bus resonators as understood by one skilled in the art.

Figure 6:
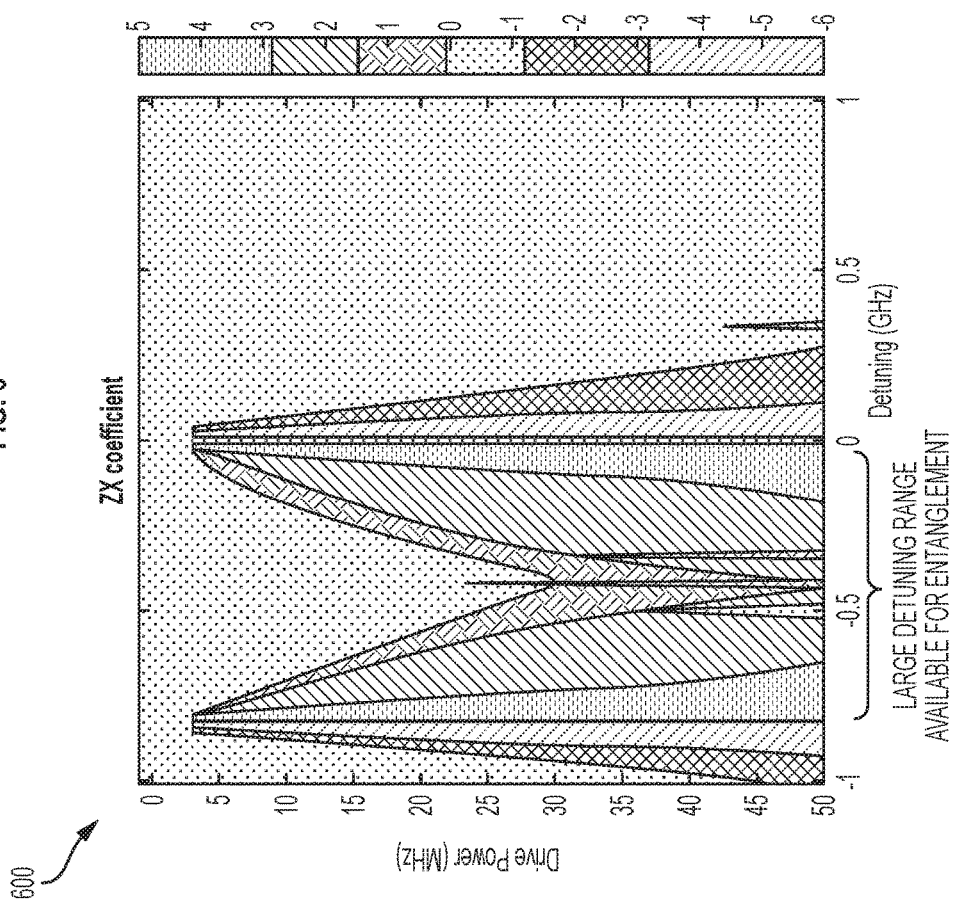
FIG. 6 is a chart of a ZX coefficient scale for large anharmonicity qubits as the control qubit and long coherence qubits as the target qubit according to embodiments of the present invention.

As mentioned above, the amount of frequency crowding is directly related to the anharmonicity of the control qubit 402 in two-qubit gates, which is the motivation for having the syndrome qubits 454 be LAQs. This can be shown using an effective Hamiltonian model for the two-qubit gate interaction. Indeed, when the syndrome qubits 454 have large anharmonicity and also are the control qubits 402 for all two-qubit gates (such as CNOT gates 420), the allowable frequency range for coupled qubits is expanded and frequency crowding is reduced. FIG. 6 is chart 600 of a ZX coefficient scale for LAQ as the control qubit and LCQ as the target qubit according to embodiments. The ZX coefficient is the term in in the Hamiltonian that allows two qubits to be entangled in order to perform the CNOT operation of the CNOT gate 420, as understood by one skilled in the art. The allowable frequency range for coupled qubits is expanded and frequency crowding is reduced as shown in FIG. 6 where experimenters have simulated an effective Hamiltonian for the cross-resonance gate (i.e., the CNOT gate 420). During this simulation, the frequency of the target qubit is fixed and the anharmonicity of the control qubit was approximately 840 MHz. The frequency of the control qubit is swept over a large range, and it can be seen there is a range of approximately 800 MHz where a significant ZX interaction (entanglement) is possible (which corresponds to the magnitude of the anharmonicity of the control qubit 402). This 800 MHz range in embodiments can be contrasted with the 300 MHz range that can be obtained with a standard transmon of anharmonicity of approximately 300-400 MHz in the state-of-the-art.

Figure 7:
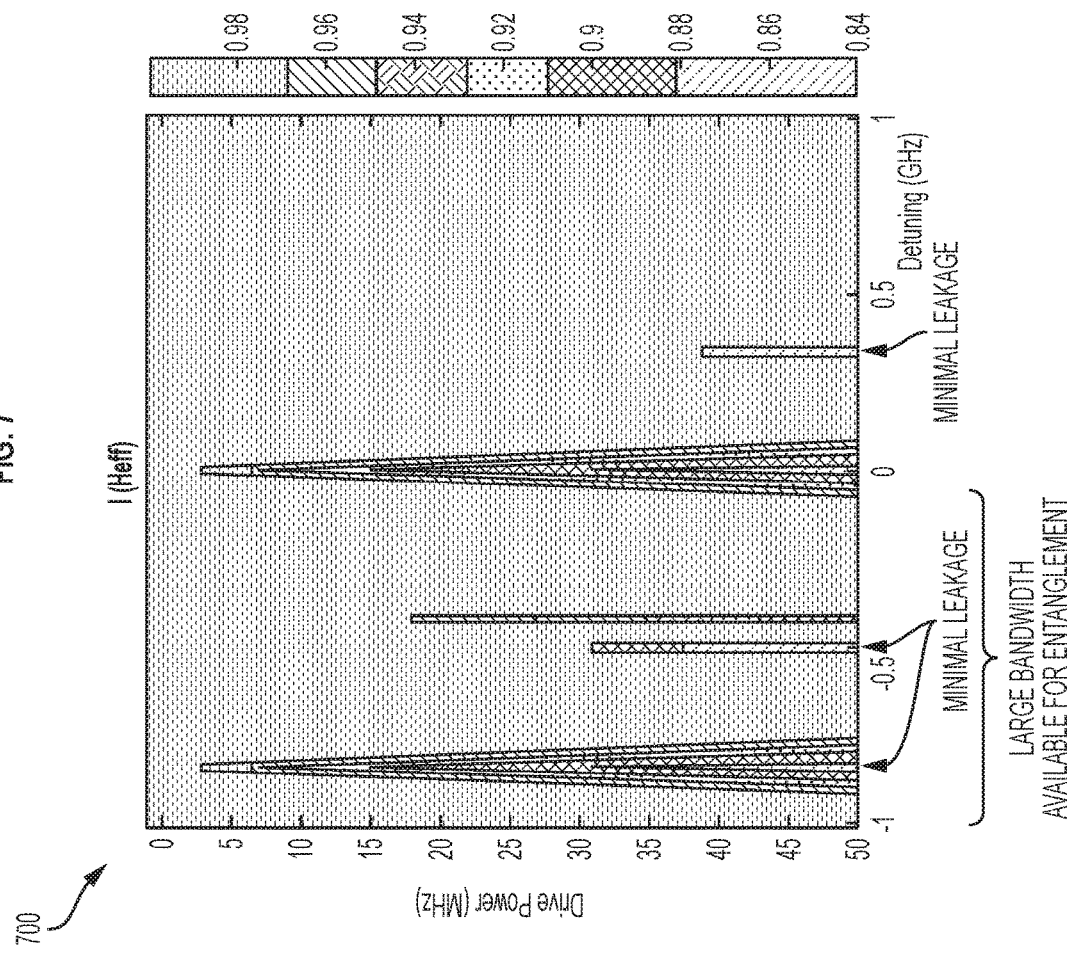
FIG. 7 is a chart of the range where a large ZX can be achieved according to embodiments of the present invention.

FIG. 7 is a chart 700 representing the information contained in the qubit subspace (where the pattern scale indicates amount of information with 1 as maximal) for LAQ as control qubit. The larger anharmonicity of the control (~840 MHz) provides a large bandwidth for minimal leakage. Particularly, the chart 700 shows the range where leakage out of the computational subspace is minimized. I ($H_{eff}$) represents the amount of information contained in the qubit subspace (normalized to 1) and helps to understand points in the detuning space to avoid.

The circuit elements of the lattice arrangement 500 can be made of superconducting material. Examples of superconducting materials (at low temperatures, such as about 10-100 millikelvin (mK), or about 4 K) include niobium, aluminum, tantalum, etc. For example, the Josephson junctions are made of superconducting material, and their tunnel junctions can be made of a thin tunnel barrier, such as an oxide. The capacitor 806 can be made of superconducting material separated by dielectric material. The wires connecting the various elements are made of a superconducting material.

FIG. 9 is a flow chart 900 of a method of configuring a circuit (e.g., the physical layout 500 of lattice arrangement) for quantum error correction according to embodiments. Reference can be made to FIGS. 1-8.

At block 902, code qubits 452 are configured as target qubits 404, where the code qubits 452 have a first dephasing time (T2) and a first anharmonicity.

At block 904, syndrome qubits 454 are configured as control qubits 402, where the syndrome qubits 454 have a second dephasing time (T2) and a second anharmonicity. One or more CNOT gates 420 are formed by the target qubits 404 and the control qubits 402. The first dephasing time (T2 of the code qubit 452) is greater than the second dephasing time (T2 of the syndrome qubit 454) and the second anharmonicity is greater than the first anharmonicity.

One syndrome qubit of the syndrome qubits 454 is configured to be coupled to four of the code qubits 452. A bus resonator 520 is configured as including two code qubits of the code qubits 452 and two syndrome qubits of the syndrome qubits 454. The two code qubits 452 may be coupled together. The two syndrome qubits 454 are configured to be coupled to the two code qubits 452.

The first dephasing time (T2) is a length of time for which code qubits 452 maintain a given superposition of states, and the second dephasing time (T2) is a length of time for which syndrome qubits 454 maintain a given superposition of states. The first anharmonicity denotes a deviation of the code qubits 452 from being a harmonic oscillator, and the second anharmonicity denotes a deviation of the syndrome qubits 454 from being a harmonic oscillator.

The code qubits 452 are transmon qubits. The syndrome qubits 454 are a loop 802 of Josephson junctions 804 shunted by a capacitor 806, where the loop 802 has more than two Josephson junctions 804.

FIG. 10 is a flow chart 1000 of a method of configuring a quantum error correction circuit 400 according to embodiments. Reference can be made to FIGS. 1-9.

At block 1002, a syndrome qubit 454 is provided. At block 1004, code qubits 452 are provided where each is coupled to the syndrome qubit 454 to form CNOT gates 420, where each of the code qubits 452 are target qubits 404 and the syndrome qubit 454 is a control qubit 452. The syndrome qubit 454 is configured to be measured to obtain a parity.

The code qubits 452 may be coupled together. The syndrome qubit 454 is in a fixed initial state, and the code qubits 452 are in a superposition of states.

Technical effects and benefits include methods and structures for optimizing physical parameters in fault-tolerant quantum computing to reduce frequency crowding. Technical benefits further include a proposed parameter regime for qubits in the surface code where code qubits are long coherence qubits and syndrome qubits are large anharmonicity qubits. The Z and X parity checks are rewritten so that syndrome qubits are control for all two-qubit gates. Z errors on syndrome (control) can naturally occur from being large anharmonicity qubits but by virtue of rewriting Z and X parity checks these are converted to measurement errors, which are more tolerable. Because only single-qubit gates are implemented on code qubits, the anharmonicity of code qubits can be decreased to increase the T2 time. Large anharmonicity of control qubits results in less frequency crowding.

The term "about" and variations thereof are intended to include the degree of error associated with measurement of the particular quantity based upon the equipment available at the time of filing the application. For example, "about" can include a range of ±8% or 5%, or 2% of a given value.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments discussed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

What is claimed is:

1. A circuit for quantum error correction, the circuit comprising:
   code qubits configured as target qubits, the code qubits having a first dephasing time and a first anharmonicity; and
   syndrome qubits configured as control qubits, the syndrome qubits having a second dephasing time and a second anharmonicity, wherein the target qubits and the control qubits being configured to form one or more controlled not (CNOT) gates, wherein the first dephasing time is greater than the second dephasing time and the second anharmonicity is greater than the first anharmonicity.

2. The circuit of claim 1, wherein one syndrome qubit of the syndrome qubits is configured to be coupled to four of the code qubits.

3. The circuit of claim 1, wherein a bus resonator is configured to include two code qubits of the code qubits and two syndrome qubits of the syndrome qubits.

4. The circuit of claim 3, wherein the two code qubits are configured to be coupled together.

5. The circuit of claim 4, wherein the two syndrome qubits are configured to be coupled to the two code qubits.

6. The circuit of claim 1, wherein the first dephasing time is a length of time for which the code qubits maintain a given superposition of states, and the second dephasing time is a length of time for which the syndrome qubits maintain a given superposition of states.

7. The circuit of claim 1, wherein the first anharmonicity denotes a deviation of the code qubits from being a harmonic oscillator, and the second anharmonicity denotes a deviation of the syndrome qubits from being a harmonic oscillator.

8. The circuit of claim 1, wherein the code qubits are transmon qubits.

9. The circuit of claim 1, wherein each of the syndrome qubits is a loop of Josephson junctions shunted by a capacitor, the loop having more than two Josephson junctions.

10. A method of configuring a circuit for quantum error correction, the method comprising:
    configuring code qubits as target qubits, the code qubits having a first dephasing time and a first anharmonicity; and
    configuring syndrome qubits as control qubits, the syndrome qubits having a second dephasing time and a second anharmonicity, wherein the target qubits and the control qubits are configured to form one or more controlled not (CNOT) gates, wherein the first dephasing time is greater than the second dephasing time and the second anharmonicity is greater than the first anharmonicity.

11. The method of claim 10, wherein one syndrome qubit of the syndrome qubits is configured to be coupled to four of the code qubits.

12. The method of claim 10, wherein a bus resonator is configured to include two code qubits of the code qubits and two syndrome qubits of the syndrome qubits.

13. The method of claim 12, wherein the two code qubits are configured to be coupled together.

14. The method of claim 13, wherein the two syndrome qubits are configured to be coupled to the two code qubits.

15. The method of claim 10, wherein the first dephasing time is a length of time for which the code qubits maintain a given superposition of states, and the second dephasing time is a length of time for which the syndrome qubits maintain a given superposition of states.

16. The method of claim 10, wherein the first anharmonicity denotes a deviation of the code qubits from being a harmonic oscillator, and the second anharmonicity denotes a deviation of the syndrome qubits from being a harmonic oscillator.

17. The method of claim 10, wherein the code qubits are transmon qubits.

18. The method of claim 10, wherein each of the syndrome qubits is a loop of Josephson junctions shunted by a capacitor, the loop having more than two Josephson junctions.

* * * * *